(12) United States Patent
Reboud et al.

(10) Patent No.: US 9,236,540 B2
(45) Date of Patent: Jan. 12, 2016

(54) LIGHT-EMITTING DIODE WITH LOCAL PHOTONIC CRYSTALS

(71) Applicant: COMMISSARIAT À L'ENERGIE ATOMIQUE ET AUX ENERGIES ALTERNATIVES, Paris (FR)

(72) Inventors: Vincent Reboud, Paris (FR); Stefan Landis, Voiron (FR); Frederic-Xavier Gaillard, Voiron (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/481,058

(22) Filed: Sep. 9, 2014

(65) Prior Publication Data

US 2015/0069443 A1    Mar. 12, 2015

(30) Foreign Application Priority Data

Sep. 9, 2013    (FR) .................................... 13 02094

(51) Int. Cl.
*H01L 33/58* (2010.01)
*H01L 33/22* (2010.01)
*H01L 33/38* (2010.01)
*H01L 33/00* (2010.01)
*H01L 33/06* (2010.01)
*H01L 33/12* (2010.01)
*H01L 33/32* (2010.01)

(52) U.S. Cl.
CPC ............ *H01L 33/58* (2013.01); *H01L 33/0025* (2013.01); *H01L 33/0075* (2013.01); *H01L 33/06* (2013.01); *H01L 33/12* (2013.01); *H01L 33/22* (2013.01); *H01L 33/32* (2013.01); *H01L 33/38* (2013.01); *H01L 2933/0016* (2013.01); *H01L 2933/0058* (2013.01); *H01L 2933/0083* (2013.01)

(58) Field of Classification Search
CPC ..... H01L 33/58; H01L 33/0025; H01L 33/12; H01L 33/06; H01L 33/0075; H01L 33/32; H01L 33/22; H01L 33/38; H01L 2933/0058; H01L 2933/0016; H01L 2933/0083
See application file for complete search history.

(56) References Cited

U.S. PATENT DOCUMENTS

| | | | |
|---|---|---|---|
| 2005/0173717 A1* | 8/2005 | Lee | H01L 33/24 257/98 |
| 2006/0192217 A1 | 8/2006 | David et al. | |
| 2008/0043795 A1 | 2/2008 | Hsueh et al. | |

OTHER PUBLICATIONS

Wang et al., "Metal-Assisted Electroless Fabrication of Nanoporous p-GaN for Increasing the Light Extraction Efficiency of Light Emitting Diodes," *AIP Advances*, vol. 2, 2012, pp. 012109-1-012109-6.

(Continued)

*Primary Examiner* — Roy Potter
*Assistant Examiner* — Paul Patton
(74) *Attorney, Agent, or Firm* — Oliff PLC

(57) ABSTRACT

The light-emitting diode includes first and second layers of semiconductor material, having opposite conductivity types, an active light-emitting area located between the first and second layers of semiconductor material, an electrode arranged on the first layer of semiconductor material and a photonic crystal formed in the first layer of semiconductor material. The photonic crystal and the electrode are separated by a distance optimized to simultaneously promote the electric injection and minimize the light absorption in the LED.

12 Claims, 7 Drawing Sheets

(56) References Cited

OTHER PUBLICATIONS

Kim et al., "Lateral Current Transport Path, a Model for GaN-based Light-Emitting Diodes: Applications to Practical Device Designs," *Applied Physics Letters*, vol. 81, No. 7, 2002, pp. 1326-1328.

Guo et al., "Current Crowding in GaN/InGaN Light Emitting Diodes on Insulating Substrates," *Journal of Applied Physics*, vol. 90, No. 8, 2001, pp. 4191-4195.

* cited by examiner

LIGHT-EMITTING DIODE WITH LOCAL PHOTONIC CRYSTALS

BACKGROUND OF THE INVENTION

The invention relates to a high power light-emitting diode, and more particularly to a diode having its light extraction improved by means of a photonic crystal.

STATE OF THE ART

Light-emitting diodes (LED) are booming, particularly in the field of lighting, due to their high power efficiency. In the category of LEDs called planar or "2D", referring to the light emission plane, two types of structure can be distinguished: the lateral MESA-type structure and the vertical structure.

FIG. 1 shows, in cross-section view, a light-emitting diode having a MESA-type structure. The MESA LED comprises a growth substrate 2 having a stack 4 of layers of semiconductor materials formed thereon. The materials used are for example III-V semiconductors based on gallium nitride (GaN, InGaN, AlGaN . . . ). The emission wavelength of the LED is then located in the blue range, around 460 nm.

Stack 4 conventionally comprises an n-type doped GaN layer 4a in contact with substrate 2, a p-type doped GaN layer 4b, and an active area 4c located between layers 4a and 4b. Active area 4c is formed of InGaN quantum wells and corresponds to the photon emission area. Layers 4a to 4c made of GaN and InGaN are epitaxially grown on growth substrate 2, for example, made of sapphire ($Al_2O_3$).

Two electrodes 6a and 6b enable to inject an electric current into the LED. Cathode 6a is arranged on n-type layer 4a, at the bottom of a well etched in semiconductor layers 4a to 4c. Anode 6b, in electric contact with p-type layer 4b, is located on the raised portion of the LED (called the mesa).

A contact layer 8 made of an electrically-conductive material is located under electrode 6b. Layer 8 aims at improving the electric contact between electrode 6b and underlying layer 4b, by spreading the current across the entire surface of layer 4b. This promotes a homogeneous injection of the current through active area 4c.

The light emitted in the LED is either extracted from the bottom, through the sapphire substrate (also transparent to the emission wavelength), or from the top, through contact layer 8. In the second case, shown in FIG. 1, the material of layer 8 is a conductive oxide transparent to the emission wavelength, for example, indium and tin oxide (ITO). A mirror 10 may cover the lower surface of substrate 2, to reflect the light emitted from layer 4c towards the substrate.

In the configuration of FIG. 1, electrodes 6a and 6b are located on the same side of substrate 2. Such a LED structure is the simplest to manufacture since the growth substrate is kept. Conversely, in the vertical structure described hereafter, the growth substrate of GaN-based layers is removed and replaced with a metal substrate behaving as an electrode.

FIG. 2 is a cross-section view of a light-emitting diode having a vertical architecture. The stack of semiconductor layers on the substrate is here reversed. N-doped GaN layer 4a corresponds to the upper portion of the LED and p-doped GaN layer 4b is in contact with the substrate. Cathode 6a is arranged on layer 4a and the substrate, made of metal, forms anode 6b.

The light is mainly emitted in active area 4c formed of quantum wells or of heterostructures. It is then extracted from the top through layer 4a. Metal substrate 6b is also used as a mirror to reflect the part of the radiation which is directed downwards. As in FIG. 1, this structure may have a contact layer 8 made of a transparent conductive material to improve the current injection.

In these two types of GaN LED, only 5% of the light radiation is emitted perpendicularly to the LED plane and efficiently extracted from the structure. The major part of the radiation is trapped in the layers of high optical index (GaN, InGaN) and propagates in planes parallel to the substrate by total internal reflection. Such a guided light should also be extracted to obtain LEDs of high brightness.

A first technique to improve the extraction of light comprises texturing the surface of the upper GaN surface (in the case of an emission from the top), that is, layer 4b in the example of FIG. 1 or layer 4a in the example of FIG. 2. Such a texturing is obtained by wet etching and generally appears in the form of pyramids or of pores having a random size. A solution of hydrofluoric acid (HF) and of potassium persulfate ($K_2S_2O_8$) under a UV illumination is, for example, provided in document ["Metal-assisted electroless fabrication of nanoporous p-GaN for increasing the light extraction efficiency of light emitting diodes", R. Wang and al., AIP Advances 2, 012109, 2012].

Such a surface roughness increases to 60% the part of the radiation extracted from the LED. A dome-shaped lens may encapsulate the LED to further improve the extraction of light (up to 80% of the emitted radiation). This dome redirects the light emitted by the LED edges.

Instead of randomly structuring the surface of the GaN layer, a second approach comprises etching holes in depth and regularly spaced apart to form a photonic crystal. A photonic crystal is a periodic structure at the scale of the wavelength with a strong optical index contrast in one, two, or three directions of space. It enables to extract by diffraction a great part of the guided light. It further enables to control the light emission diagram, in particular, the angles of the extraction cone. This results in an increase of the LED brightness by a factor two as compared with a randomly textured surface.

The semiconductor layers of the light-emitting diode are obtained by epitaxy on the growth substrate. The layers located between the substrate and the active area are thick, of a few hundreds of nanometers and some ten micrometers, to obtain a defect-free growth of the active area. Generally, a buffer layer enables to adapt the mesh parameter between the substrate and the active area and concentrates growth defects, such as dislocations.

Because of these geometric constraints, the guiding of the light in the LED planes is multimode. In other words, the light energy is distributed in a fundamental mode, of an order equal to 1, and in harmonics, of orders greater than 1. The fundamental mode, which generally contains the greatest amount of light energy, is contained in the active area while modes of higher orders are guided by another layer of the LED, or even a plurality of layers.

To extract the light coupled in different modes, deep photonic crystals should be etched, to in the order of some hundred nanometers in the case of MESA LEDs, up to a plurality of micrometers in the case of vertical LEDs, all the way to the active area and sometimes even beyond. However, such an etching is difficult to perform and the close structuring of the active area increases losses by non-radiative recombinations.

Document US2006/0192217 further provides controlling the emission modes of the guided light, to increase the proportion of light extracted by the photonic crystal.

FIGS. 3 and 4 schematically show two alternative vertical LEDs having a controlled light emission, according to the teachings of document US2006/0192217.

Each LED comprises, in addition to growth substrate 2 and to stack 4 of GaN or InGaN layers, a buffer layer 12 and an optical confinement layer 14 made of AlGaN. Layers 12 and 14 are located between growth substrate 2 and p-type layer 4b.

After the successive growth of layers 12, 14, 4b, 4c, and 4a on substrate 2, a photonic crystal 18 is etched in the upper portion of layer 4a, opposite to substrate 2. Then, an electrode 6a is formed of GaN layer 4a. Growth substrate 2 is removed and replaced with a metal electrode 6b, thus completing the vertical LED structure.

AlGaN confinement layer 14 has a lower optical index than GaN adjacent layers 12 and 4b. This promotes optical modes propagating in the layers located close to photonic crystal 18 (layers 4a, 4b, and quantum wells 4c), to the detriment of the modes located under confinement layer 14 (that is, in buffer layer 12). Thus, the guided light is mainly emitted in modes having a good overlapping with the photonic crystal.

In the structure of FIG. 3, electrode 6a is located at the level of photonic crystal 18. Thus, area 16 of quantum wells 4c, located vertically in line with electrode 6a and where radiative recombinations are the strongest, coincides with the photonic crystal. This enables to immediately extract the light emitted in area 16, before it propagates transversely in the LED.

However, where electrode 6a is arranged outside of the photonic crystal, as shown in FIG. 4, the geometry of the photonic crystal should be adapted to optimize the optical coupling between the guided light (represented by a moving wave) and photonic crystal 18. It is thus avoided for part of the guided light to be reflected by the walls of crystal 18.

For this purpose, document US2006/0192217 provides etching holes 20 having a progressively-varying diameter, period, and/or depth (FIG. 4). However, a fine variation of these geometric parameters is difficult to obtain with conventional techniques of dry etching of photonic crystals (plasma type). Such a photonic crystal of optimized geometry is thus in practice only seldom used.

To compensate for a better extraction of light, confinement layer 14 of document US2006/0192217 considerably increases the electric resistance and the operating voltage of the LED. Such a layer further introduces dislocations in the upper GaN layers, due to the difference between their mesh parameters. Now, such dislocations adversely affect the LED efficiency since they act as non-radiative recombination centers.

SUMMARY

There appears to be a need for a light-emitting diode having both a good light extraction and good electrical properties.

This need tends to be satisfied by the provision of a light-emitting diode provided with the following elements:
- a first layer of a doped semiconductor material of a first conductivity type;
- a second layer of a doped semiconductor material of a second opposite conductivity type;
- an active light-emitting area located between the first and second layers of semiconductor material;
- an electrode arranged on the first layer of semiconductor material; and
- a photonic crystal formed in the first layer of semiconductor material.

The photonic crystal and the electrode are separated by a distance L verifying, to within 10%, the following equation:

$$L = \frac{L_S}{\alpha L_S - 1} \ln\left(\frac{(\eta_B - \eta_A) \cdot \alpha L_S}{\eta_B - \eta_A \alpha L_S}\right)$$

wherein:
- $L_S$ is the distance, from the electrode, at which the current density in the active light-emitting area is equal to the current density under the electrode divided by e;
- $\alpha$ is the absorption coefficient of the light modes propagating in the first and second layers of semiconductor material and in the active light-emitting area;
- $\eta_A$ is the light extraction coefficient in a portion of the first and second layers of semiconductor material and of the active light-emitting area, located between the electrode and the photonic crystal; and
- $\eta_B$ is the light extraction coefficient in the area of the photonic crystal.

To homogenize the electric current in the active area, the electrode may comprise a plurality of electrically-conductive tracks. The photonic crystal then advantageously comprises a plurality of light extraction areas distributed in the first semiconductor material layer, each extraction area being located between two electrically-conductive tracks.

According to a development, each extraction area is located at an equal distance from the two electrically-conductive tracks.

According to another development, the distribution of the extraction areas in the first semiconductor material layer is periodic.

Preferably, two consecutive extraction areas are separated by a distance shorter than the average distance traveled by photons before they are absorbed in the semiconductor material.

The photonic crystal preferably comprises periodically spaced apart holes extending through the first layer of semiconductor material all the way to the active light-emitting area.

Advantageously, the holes of the photonic crystal also extend through the active light-emitting area.

A simple and fast-to-implement method is further provided to form a light-emitting diode with an optimized photonic crystal.

The method comprises the steps of: providing a first layer of a doped semiconductor material of a first conductivity type, a second layer of a doped semiconductor material of a second opposite conductivity type, and an active light-emitting area located between the first and second layers of semiconductor material; forming an electrode on the first layer of semiconductor material, and etching a photonic crystal in the first layer of semiconductor material.

The photonic crystal and the electrode are separated by a distance L verifying, to within 10%, the following equation:

$$L = \frac{L_S}{\alpha L_S - 1} \ln\left(\frac{(\eta_B - \eta_A) \cdot \alpha L_S}{\eta_B - \eta_A \alpha L_S}\right)$$

wherein:
- $L_S$ is the distance, from the electrode, at which the current density in the active light-emitting area is equal to the current density under the electrode divided by e;
- $\alpha$ is the absorption coefficient of the light modes propagating in the first and second semiconductor material and in the active light-emitting area;

$\eta_A$ is the light extraction coefficient in a portion of the first and second layers of semiconductor material and of the active light-emitting area, located between the electrode and the photonic crystal; and $\eta_B$ is the light extraction coefficient in the area of the photonic crystal.

The photonic crystal may be etched through a mask comprising a plurality of recesses, which results in a plurality of light extraction areas distributed in the first semiconductor material layer.

The electrode may be formed of a plurality of electrically-conductive tracks, one track being arranged between each pair of consecutive extraction areas.

In a preferred embodiment, the etching of the photonic crystal is obtained by anodic dissolution under ultraviolet rays of the layer of semiconductor material.

BRIEF DESCRIPTION OF THE DRAWINGS

The foregoing and other features and advantages will more clearly appear from the following non-limiting description of specific embodiments in connection with the accompanying drawings, among which.

DESCRIPTION OF A PREFERRED EMBODIMENT

Figure 2:
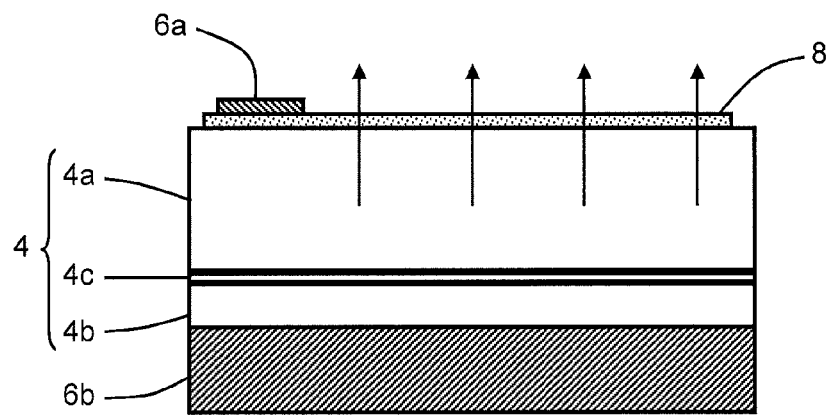
FIG. 2 schematically shows a light-emitting diode (LED) having a vertical structure according to prior art.
Figure 3:
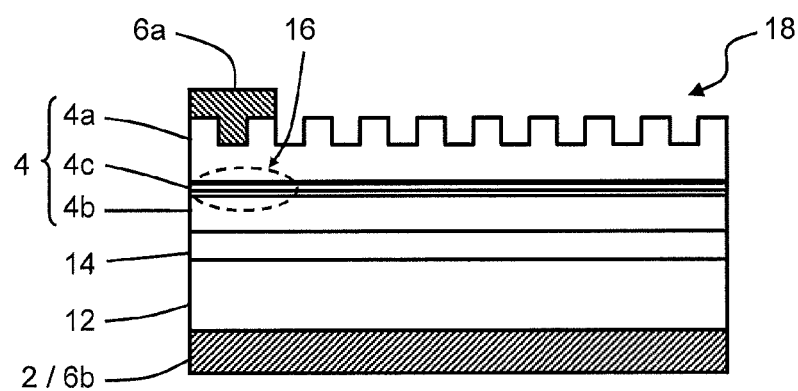
FIGS. 3 and 4 show two alternative embodiments of a vertical LED provided with a photonic crystal according to prior art.
Figure 4:
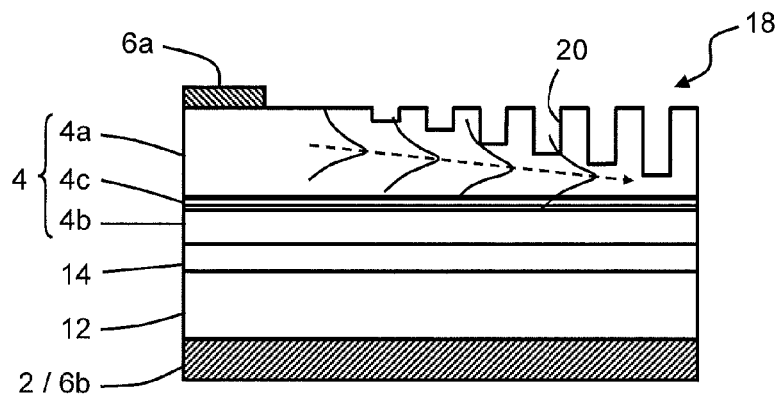

In the following description, the example of a planar light-emitting diode (LED) having a vertical structure, where the light is extracted from the top, opposite to the substrate, will be used. As described in relation with FIG. 2, this LED comprises a stack 4 of semiconductor material layers and two electrodes, 6a and 6b, on either side of the stack. Stack 4 for example comprises an n-type doped GaN layer 4a, a p-type doped GaN layer 4b, and an active light-emitting area 4c located between layers 4a and 4b. Active area 4c is preferably formed of InGaN/GaN quantum wells, that is, of InGaN layers alternating with GaN layers.

Figure 5:
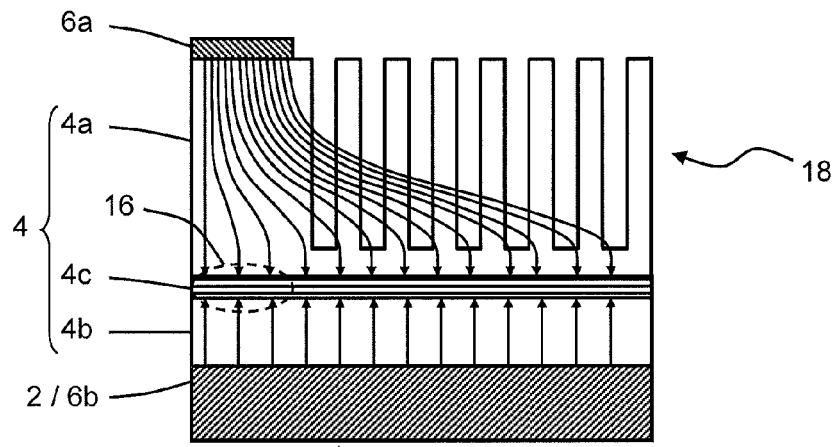
FIG. 5 schematically shows the electric injection into the LED of FIG. 3.

FIG. 5 illustrates the injection of the electric current into the light-emitting diode of vertical structure, and more particularly the current lines between electrodes 6a and 6b. The arrows located in semiconductor layer 4a symbolize the path traveled by electrons from cathode 6a while the arrows of semiconductor layer 4b symbolize the path traveled by holes originating from anode 6b. The electrons and holes meet in active area 4c and recombine, thus generating photons.

In this example of a diode, upper electrode 6a is located on one edge of the LED (on the left-hand side in FIG. 5). It thus has, in cross-section view, a first lateral wall aligned with an edge of stack 4 and a second lateral wall recessed from an opposite edge of stack 4. Lower electrode 6b is formed of an electrically-conductive substrate, for example, made of metal, placed on the LED after removal of growth substrate 2. Electrode 6b takes up the entire surface of the LED, unlike electrode 6a.

As previously indicated, radiative recombinations are by a larger number in a portion 16 of active area 4c located vertically in line with upper electrode 6a. This is due to a strong electric current density under electrode 6a. However, the further away it is drawn from electrode 6a, the more the current density decreases. The electric current in layer 4a and in active area 4c is thus inhomogeneous. Such an inhomogeneity is schematized by a longer and longer travel length of electrons in FIG. 5.

In document US2006/0192217, the vertical LED further comprises a photonic crystal to improve the extraction of light. To assess the influence of the photonic crystal on the electric injection, photonic crystal 18 has been super-posed to the current lines of FIG. 5. Crystal 18 is formed in a significant portion of GaN layer 4a, next to cathode 6a. It can thus be observed that the photonic crystal will prevent the electron transport and disturb the electric injection. This results in a decrease of the current density in the active light-emitting area and, accordingly, of the number of generated photons.

Thus, the injection of the electric current into the active light-emitting area of a LED may be strongly deteriorated by a photonic crystal if the electrode is not carefully positioned with respect to this photonic crystal.

To obtain a LED simultaneously having a good light extraction and a good electric injection, it is provided hereafter to limit the photonic crystal to one or a plurality of areas of semiconductor layer 4a which are distant with respect to electrode 6a. The current density in these areas being low, they may be used as light extraction areas without drastically decreasing the electric performance.

Figure 6:
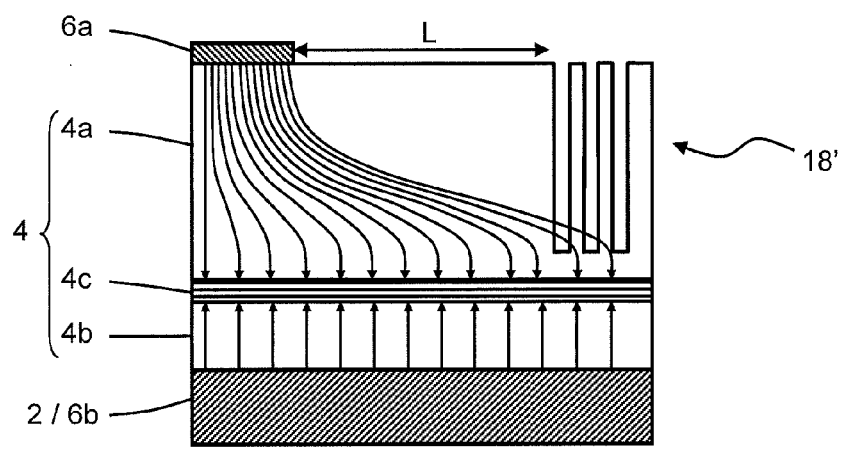
FIG. 6 shows a generic embodiment of a vertical LED provided with a local photonic crystal according to the invention, and the electric injection into this LED.

FIG. 6 shows a generic embodiment of such a light-emitting diode with a local photonic crystal 18'. Photonic crystal 18' here comprises a single light extraction area.

Unlike prior art LEDs, photonic crystal 18' occupies a small portion of GaN semiconductor layer 4a. It thus only interferes with a small number of current lines. Further, crystal 18' is placed at a distance L from electrode 6a, so that this only concerns the lines transporting the smallest amount of current.

Photonic crystal 18' is formed by etching holes in GaN layer 4a. These holes are periodically spaced apart, preferably in at least two directions of the plane of layer 4a (2D photonic crystal). The periodicity in crystal 18' is of the same order of magnitude as the LED emission wavelength. A period of the photonic crystal is selected to be between 200 nm and 2 µm for a GaN LED.

The dimensions of extraction area 18' preferably correspond to some ten periods, that is, between 2 µm and 10 µm. Such a small number of periods does not adversely affect light extraction. Indeed, since the guided light propagates transversely in the LED, that is, in a plane parallel to the substrate, it necessarily reaches extraction area 18'.

To quantify distance L separating photonic crystal 18' from upper electrode 6a, the lateral transport of the electric current in the LED of FIG. 5 has been thoroughly studied, by means of an electrical model taken from article ["Current crowding in GaN/InGaN light emitting diodes on insulating substrates"; X. Guo and al., Journal of Applied Physics, vol. 90, num. 8, 2001]. In this model, a LED is equivalent to an electric circuit formed of resistors and of diodes. The circuit resistors correspond to the contact resistances (on the anode side) and to the resistivity of the n- or p-doped GaN layers. The diodes correspond to the p-n junction of the LED.

Figure 7:
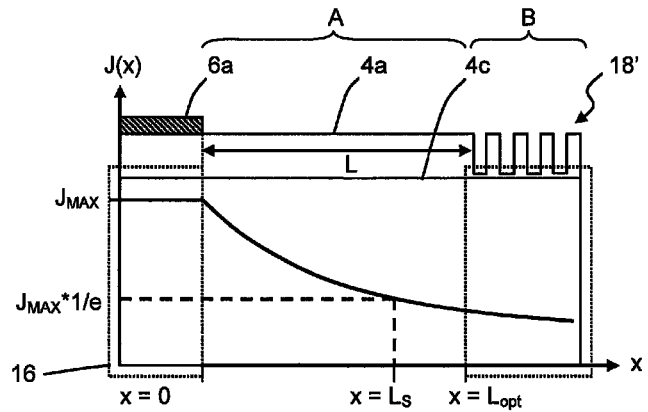
FIG. 7 schematically shows the variation of the current density in the LED of FIG. 6.

FIG. 7 shows the results of this study. It superimposes a LED diagram according to FIG. 6 with a graph of the current density J(x) along active area 4c. The axis of ordinates corresponds to current density J and the axis of abscissas corresponds to a lateral position x of a point in the active area. By convention, the edge of electrode 6a which is recessed with respect to a lateral wall of the LED has been selected as the starting point for position x. In other words, the right edge of electrode 6a corresponds to the origin of the axis of abscissas (x=0) in FIG. 7.

In portion 16 of active area 4c located under electrode 6a, that is, for negative values of x, current density J is maximum. The density variation in this area is negligible as compared with the density decrease outside of the electrode. It can thus reasonably be assumed that the current density in portion 16 of the active area is constant and equal to maximum density $J_{MAX}$.

However, current density J(x) in the active area of a LED abruptly decreases from the edge of the electrode (x=0). According to the above-mentioned electric model, such a decrease is exponential. Density J(x) is provided by the following relation (1):

$$J(x) = J_{MAX} \exp\left(-\frac{x}{\sqrt{\frac{t_n(\rho_c t_c + \rho_p t_p)}{\rho_n}}}\right), \quad (1)$$

involving resistivity $\rho_n$, and thickness $t_n$ of the n-type doped GaN layer (ref. 4a), resistivity $\rho_p$ and thickness $t_p$ of the p-type doped GaN layer (ref. 4b in FIG. 6), resistivity $\rho_c$ and thickness $t_c$ of contact electrode 6a.

Based on relation (1), a length $L_S$ of lateral attenuation of the current density is defined as being position x at which density J is decreased by a factor 1/e with respect to its maximum value $J_{MAX}$ at the electrode edge, that is: $J(x=L_S)=J_{MAX}\cdot\exp(-1)$.

Lateral attenuation length $L_S$ can then be expressed as follows:

$$L_S = \sqrt{\frac{t_n(\rho_c t_c + \rho_p t_p)}{\rho_n}}. \quad (2)$$

Now that the electrical model has been established, the quantity of light generated by the LED can be expressed and the value of distance L for which said quantity is maximum can be estimated (L being the distance between electrode 6a and photonic crystal 18').

The light intensity generated by the LED is proportional to the current density in active area 4c. In addition to density J(x), account is taken of the absorption of light by the semiconductor materials of semiconductor layers 4a-4b and of active area 4c. Indeed, part of the emitted light is lost when it propagates in the plane of layers 4a-c.

The total light intensity of the LED has two components:
light intensity $I_A$ corresponding to the light extracted by the portion of layers 4a, 4b, and 4c located between electrode 6a and photonic crystal 18' (area A in FIG. 7); and
light intensity $I_B$ corresponding to the light extracted by photonic crystal 18' (area B).

Each component is weighted by a light extraction coefficient in the concerned area. Considering a refraction index of layers 4a-4c of 2.5, the extraction efficiency of area A, noted $\eta_A$, is low, approximately 5%. However, photonic crystal 18' is sized so that almost all the guided light is extracted. Extraction efficiency $\eta_B$ in area B is thus close to 100%.

Only area A of active area 4c takes part in the light emission. In area B, active layer 4c emits almost no more light, since the forming of the photonic crystal very adversely affects the electric injection.

In other words, 95% of the light emitted in the LED (that is, area A) remains trapped in the LED and forms the guided light. This guided light is partially absorbed by the semiconductor materials forming layers 4a to 4c, during its displacement to area B of the photonic crystal. Once it has arrived in area B, the remaining guided light is extracted with almost no loss due to the photonic crystal.

Light intensity $I_A$ is proportional to current density J(x) multiplied by extraction efficiency $\eta_A$. Conversely to area B, the light of area A is almost not submitted to the absorption, it is immediately extracted. The following relation is thus obtained:

$$I_A(x) \propto \eta_A \cdot J(x) \propto \eta_A \cdot \exp\left(-\frac{x}{L_S}\right) \quad (3)$$

Due to the absorption, light intensity $I_B$ decreases exponentially according to the distance traveled by light in area A. Referring to FIG. 7, the light is emitted at any position x in area A, and is then absorbed along a distance L−x that it still has to travel to reach photonic crystal 18'.

Intensity $I_B$ is thus proportional to current density J(x) multiplied by extraction efficiency $\eta_B-\eta_A$ and by the light absorption coefficient in the GaN structure in area A:

$$I_B(x) \propto (\eta_B - \eta_A) \cdot J(x) \cdot \exp[-\alpha(L-x)] \propto \quad (4)$$
$$(\eta_B - \eta_A) \cdot \exp(-\alpha L) \cdot \exp\left[-\frac{x}{L_S}(1-\alpha L_S)\right]$$

To know the total intensity $I_{tot}$ of the light extracted by areas A and B, intensities $I_A(x)$ and $I_B(x)$, expressed for any position x, are integrated between 0 (right-hand edge of the electrode) and L (left-hand edge of the photonic crystal). Beyond position x=L, active area 4c is sacrificed, to the benefit of light extraction. There thus is no emitted light.

Thus, by integrating above relations (3) and (4) between 0 and L, an approximate relation (to within a constant) of the total light intensity according to distance L is obtained:

$$I_{tot} \propto \quad (5)$$

$$\int_0^L \eta_A \cdot \exp\left(-\frac{x}{L_S}\right) + \int_0^L (\eta_B - \eta_A) \cdot \exp(-\alpha L) \cdot \exp\left[-\frac{x}{L_S}(1 - \alpha L_S)\right] \propto$$

$$\eta_A \cdot L_S \cdot \left[1 - \exp\left(-\frac{L}{L_S}\right)\right] +$$

$$(\eta_B - \eta_A) \cdot \frac{L_S}{1 - \alpha L_S} \cdot \exp(-\alpha L) \cdot \left(1 - \exp\left[-\frac{L}{L_S}(1 - \alpha L_S)\right]\right)$$

The above relations do not take into account the light emitted under the electrode, that is, current density $J_{max}$, since the electrode dimensions are small, much smaller than distance L and the dimensions of the photonic crystal. The light emitted under the electrode is thus negligible.

Figure 8:
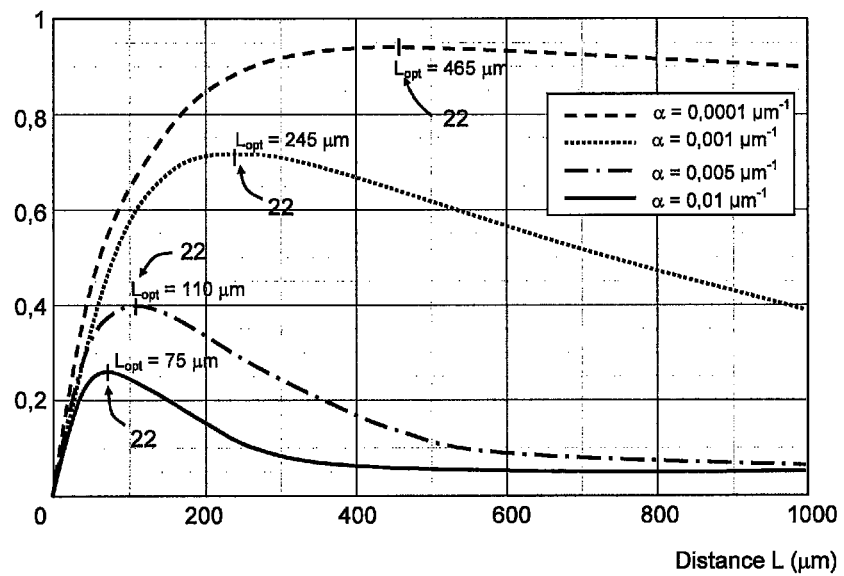
FIG. 8 is a diagram of the light intensity extracted by a vertical LED according to the distance between the electrode and the photonic crystal, for different light absorption values.

FIG. 8 is a graph showing light intensity $I_{tot}$ of the LED of FIGS. 6 and 7 as a function of distance L between electrode 6a and photonic crystal 18', according to relation (5). In this example, a lateral attenuation length $L_S$ equal to 97 μm and different values of absorption coefficient α have been selected.

This graph shows, for each value of α, the existence of a maximum light intensity value 22. For too short distances L, that is, before light intensity peak 22, the quantity of light is limited, since the photonic crystal strongly disturbs the electric injection. Conversely, for too long lengths L, the quantity of light rapidly decreases due to the absorption phenomenon. FIG. 8 thus illustrates the compromise between electric injection and light absorption in the light intensity of a LED.

There thus is an optimal position at which the photonic crystal should be placed to obtain a maximum light intensity $I_{tot}$. Such an optimal distance between the photonic crystal and the electrode, noted $L_{opt}$ in FIG. 7, may be determined for each LED by means of above relation (5). Optimal distance $L_{opt}$ is for example obtained by calculating the derivative of $I_{tot}$ according to L, that is $$\frac{\partial I_{tot}}{\partial L},$$

and then by solving equation:

$$\frac{\partial I_{tot}}{\partial L} = 0 \quad (6)$$

The optimal position of crystal 18' with respect to electrode 6a, that is, the solution of equation (6), can be written as:

$$L_{opt} = \frac{L_S}{\alpha L_S - 1} \ln\left(\frac{(\eta_B - \eta_A) \cdot \alpha L_S}{\eta_B - \eta_A \alpha L_S}\right) \quad (7)$$

Thus, to optimize the production of light by the vertical LED of FIGS. 6 and 7, photonic crystal 18' is placed at a distance L from electrode 6a such that $0.9 \cdot L_{opt} \leq L \leq 1.1 \cdot L_{opt}$. In other words, a distance L verifying, to within 10%, the following equation is selected:

$$L = \frac{L_S}{\alpha L_S - 1} \ln\left(\frac{(\eta_B - \eta_A) \cdot \alpha L_S}{\eta_B - \eta_A \alpha L_S}\right)$$

wherein:
$L_S$ is the lateral attenuation length, that is, the distance from the electrode at which the current density in the active light-emitting area is equal to $J_{MAX}/\exp(1)$;
α is the absorption coefficient of the light modes propagating in layers 4a to 4c of the LED;
$\eta_A$ is the light extraction coefficient in portion A of layers 4a to 4c; and
$\eta_B$ is the light extraction coefficient in the photonic crystal area (portion B).

In a preferred embodiment, upper electrode 6a, here the cathode, comprises a plurality of electrically-conductive tracks to homogenize the injection of electric current into the LED. In this case, the photonic crystal may be split up into a plurality of extraction areas 18', such as that in FIG. 6. The extraction areas are distributed in GaN layer 4a and are distant from the conductive tracks of the electrode to minimize their impact on the electric injection. Of course, each extraction area can be considered as a photonic crystal in its own right, since they are separate in GaN layer 4a.

Figure 9:
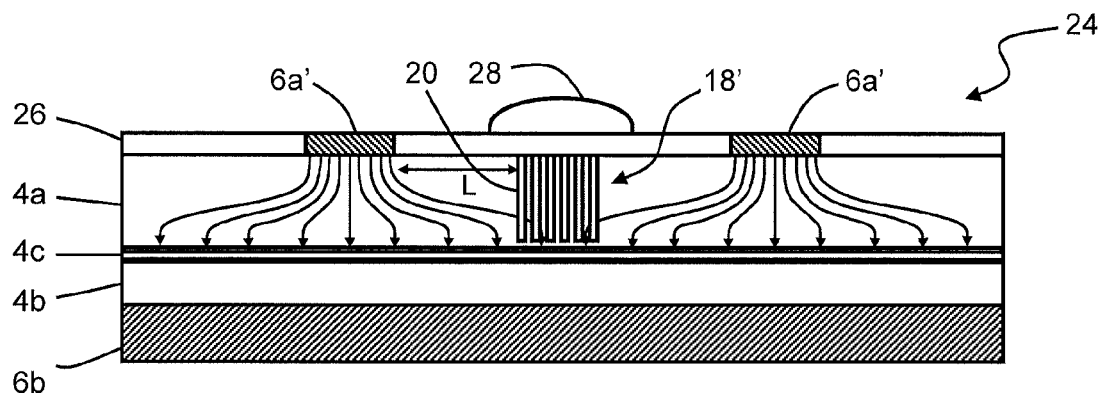
FIG. 9 is a cross-section view of a portion of a vertical LED with local photonic crystals according to the invention.

FIG. 9 is a transverse view of a vertical LED portion 24, according to this preferred embodiment. For clarity, only two electrically-conductive tracks 6a' and one extraction area 18' are shown. Extraction area 18' is located between the two tracks 6a', at a distance L from at least one conductive track, L verifying relation $0.9 \cdot L_{opt} \leq L \leq 1.1 \cdot L_{opt}$. Advantageously, extraction area 18' is located at an equal distance from the two conductive tracks 6a'.

The LED may also comprise a planarizing layer 26 arranged on GaN layer 4a. Layer 26 advantageously has the same thickness as conductive tracks 6a' and coats the lateral surfaces of these tracks. Finally, a dome-shaped lens 28 is advantageously formed on layer 26, vertically in line with extraction area 18', to shape the light beam extracted from the LED.

In the embodiments of FIGS. 6 and 9, photonic crystal 18' is etched deeply into GaN layer 4a all the way to active area 4c, without however crossing it. Preferably, the portion of layer 4a separating the bottom of photonic crystal 18' from active area 4c has a thickness in the range from 10 nm to 2 μm.

Figure 10:
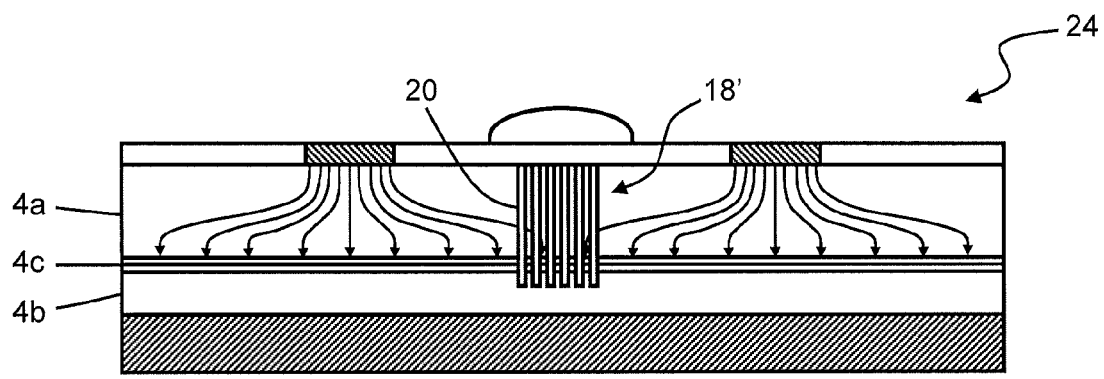
FIG. 10 is a cross-section view of an alternative embodiment of the LED of FIG. 9.

In an alternative embodiment shown in FIG. 10, holes 20 of photonic crystal 18' extend in active area 4c. This enables to extract more light (all modes of an order smaller than or equal to 5), particularly the fundamental mode. Indeed, a direct optical coupling of the fundamental mode with the photonic crystal is thus achieved.

Such a structuring of active area 4c generates, as a counterpart, non-radiative recombination centers, which decreases the LED efficiency. This phenomenon however remains limited, since the photonic crystal now occupies small portions of the active area.

Holes 20 may cross active area 4c and emerge into GaN layer 4b (FIG. 10). As a variation, the etching of holes 20 may end in active area 4c (not shown).

In the embodiments of FIGS. 9 and 10, the shape and dimensions of the holes 20 of an extraction area 18' are identical. They particularly have the same depth.

Figure 11:
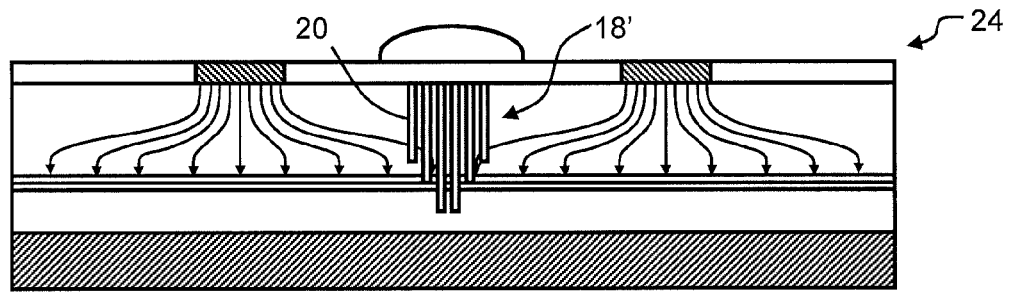
FIG. 11 is a cross-section view of another alternative embodiment of the LED of FIGS. 9 and 10.

FIG. 11 shows in transverse view another variation of photonic crystal 18', where holes 20 have a variable depth. The depth progressively increases from the outside to the center of extraction area 18'. This enables to slowly adapt the optical refraction index, thus limiting the reflection of the light guided by the walls of holes 20. This results in a better coupling of the guided light with the photonic crystal. A progressive variation of the hole width or of the period of the photonic crystal also provides such a better coupling.

Figure 12:
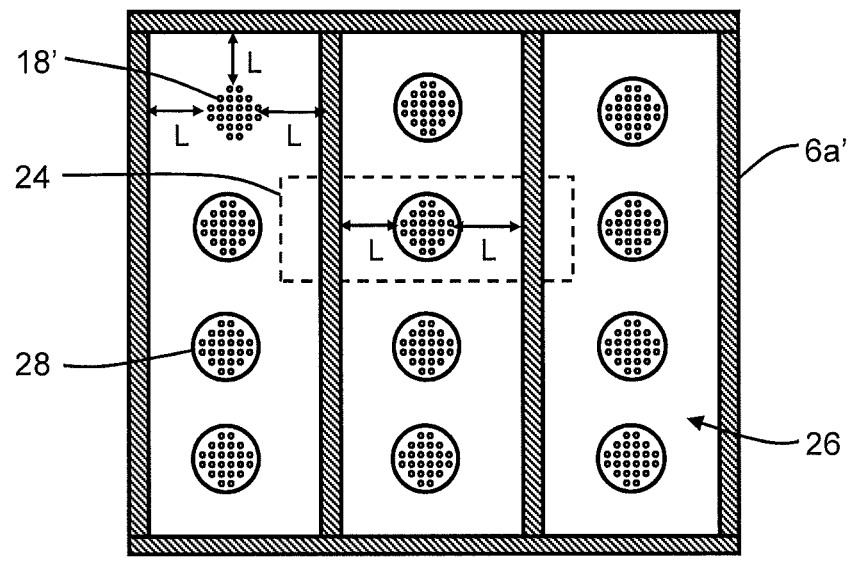
FIG. 12 is a general top view of a vertical LED with local photonic crystals according to the invention.

FIG. 12 is a general top view of the LED with local photonic crystals 18'. Portion 24 of the LED shown in cross-section view in FIGS. 9 to 11 is shown by a square in dotted lines in FIG. 12. The upper electrode for example comprises four conductive tracks 6a' at the periphery of the LED and two additional tracks through layer 26, joining two opposite sides of the LED. Thus the LED surface is divided into three portions, having a substantially constant surface area.

Four extraction areas 18', each covered with a lens 28, are distributed in each portion. Preferably, the distance of each extraction area to the adjacent tracks 6a' is equal to above-defined distance L ($0.9 \cdot L_{opt} \leq L \leq 1.1 \cdot L_{opt}$).

As shown in FIG. 12, electrically-conductive tracks 6a' are preferably interconnected and distributed over the entire surface of the GaN layer. They are then submitted to the same electric potential, which tends to uniformize the current density in the active area. They are for example made of metal (gold, aluminum, nickel, titanium) or of an alloy of a plurality of metals.

With a plurality of metal tracks 6a', the current density in active area 4c is generally higher than with a single track. Further, the presence of a plurality of areas 18' distributed in layer 4a eases the extraction of photons, which are by a larger number. Indeed, the latter have less distance to travel to reach an extraction area, and this, whatever their emission point in the active area.

Of course, the number of metal tracks 6a' and the number of extraction areas 18' comprised in the photonic crystal may vary from one light-emitting diode to another, particularly according to the dimensions of the LED. Generally, the larger the surface area occupied by the LED, the greater the number of conductive tracks and of extraction areas.

Figure 13:
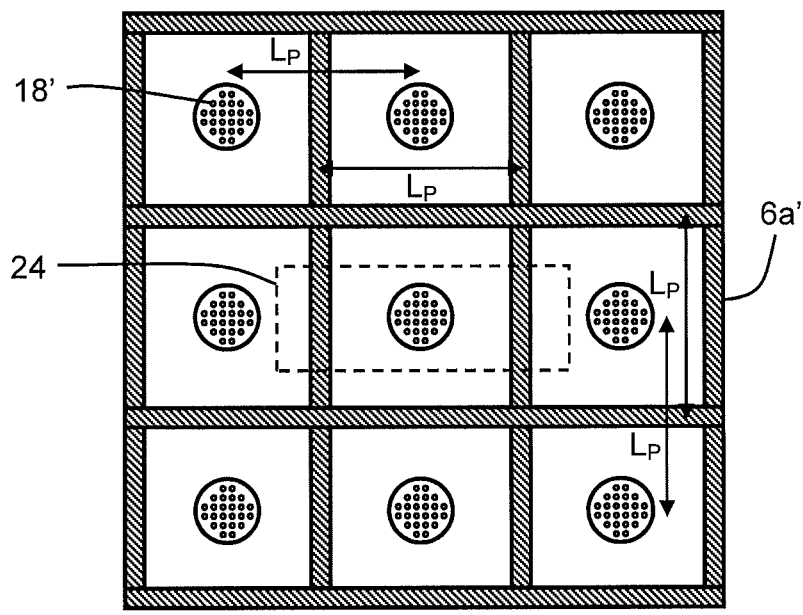
FIG. 13 is another top view of a vertical LED with local photonic crystals according to the invention.

FIG. 13 is a second top view of the vertical LED illustrating another way to distribute metal tracks 6a' of the electrode and extraction areas 18' of the photonic crystal. Each area 18' is surrounded with four metal tracks 6a'. The upper electrode thus forms a grid pattern at the surface of the LED. Extraction areas 18' are preferably spaced apart by a same distance L from their respective metal tracks 6a.

In this embodiment, as in that of FIG. 12, extraction areas 18' and metal areas 6a' in the GaN layer have a periodic distribution. The periodicity may be achieved along the two dimensions of the plane of layer 4a, as in FIG. 13, or in single direction. In FIG. 12, for example, this translates as a group of four extraction areas 18' surrounded with four metal tracks 6a' and repeated three times on the LED surface, from left to right.

The distance between two consecutive extraction areas 18', which thus corresponds to the period or to the repetition pitch of these patterns, is preferably between 1 μm and 500 μm. It is advantageously smaller than the average distance traveled by photons before they are absorbed by semiconductor material GaN. This distance may be called the average free travel. Thus, a large number of photons may be extracted from the LED before their energy runs out in the GaN semiconductor material.

As shown in FIG. 13, period $L_P$ of extraction areas 18' is preferably equal to that of metal tracks 6a'. Further, when all areas 18' and all tracks 6a have identical dimensions, a perfectly symmetrical distribution is obtained at the surface of the LED. In such conditions, the electric injection and the light extraction are both optimized.

The LED with local photonic crystal(s) of FIGS. 6 to 13 has been described hereabove in relation with a structure of vertical type. Of course, nothing prevents transposing these embodiments to the case of a LED having a MESA structure. The relations of the current density (1), of the lateral attenuation length (2), and of optimal length $L_{opt}$ (7) are unchanged, although the stack of semiconductor layers is reversed.

In GaN planar light-emitting diodes, p-type doped layer 4b has a high resistivity as compared with the resistivity of n-type doped layer 4a (respectively in the order of 2 Ω·cm and of 0.011 Ω·cm).

Now, in the MESA structure, p-type doped layer 6b is located at the light extraction level, in contact with the upper electrode (anode 6b), and its resistivity is majorly responsible for the inhomogeneity of the electric current in the active area.

To spread the current over the entire surface of the LED, an electric injection layer transparent to the emission wavelength and having an electric conductivity greater than that of layer 6b is currently inserted between layer 4b and anode 6b. Such an injection layer, for example, made of ITO, aims at limiting current crowding effects and at uniformizing the electric injection, without totally succeeding in doing so.

This additional injection layer may be taken into account in the electrical model of the current density. This is actually the subject matter of article ["Lateral current transport path, a model for GaN-based light-emitting diodes: Applications to practical device designs"; H. Kim and al., Applied Physics Letters, vol. 81, num. 7, 2002].

Taking into account the current injection layer, the relation of current density J(x) in the active area is modified as follows:

$$J(x) = J_{MAX} \exp\left(-\frac{x}{\sqrt{(\rho_c t_c + \rho_p t_p)\left|\frac{\rho_n}{t_n} - \frac{\rho_e}{t_e}\right|^{-1}}}\right), \quad (1')$$

$\rho_e$ being the resistivity of the injection layer and $t_e$ being its thickness.

Lateral attenuation length $L_S$ can then be written as:

$$L_S = \sqrt{(\rho_c t_c + \rho_p t_p)\left|\frac{\rho_n}{t_n} - \frac{\rho_e}{t_e}\right|^{-1}}. \quad (2')$$

In a LED of vertical type, an injection layer is seldom used since P-type GaN layer 4b, is generally in contact with an electrically-conductive substrate behaving as an electrode over its entire surface. However, if the substrate is not conductive, it is preferable to use the electric injection layer, which then appears in the form of a metal layer, between the substrate and layer 6b. It also covers the entire surface of layer 6b and is further used as a mirror to reflect part of the light. In one case as in the other, the injection of holes into p-GaN layer 6b is practically homogeneous. Only the electron injection is responsible for the inhomogeneity of the current density in the active area.

The metal injection layer of a vertical LED has a resistivity $\rho_e$ much lower than resistivity $\rho_n$ of n-GaN layer 4a. Accordingly, for a vertical LED, term $\rho_e/t_e$ of above relations (1') and (2') can be neglected with respect to term $\rho_n/t_n$. This then results in previous relations (1) and (2).

As a summary, relations (1) and (2) are suitable for a mesa LED with no injection layer and any type of vertical LED, while relations (1') and (2') should be preferred for a MESA LED provided with a hole injection layer.

Figure 1:
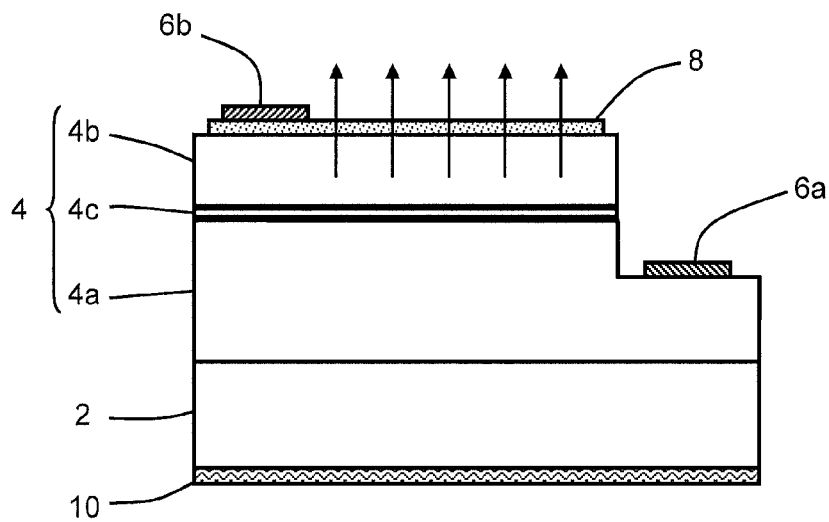
FIG. 1 schematically shows a LED having a MESA structure according to prior art.

Table 1 hereabove gathers the values of parameters α, $ρ_n$, $t_n$, $ρ_p$, $t_p$, $ρ_c$, $t_c$, $ρ_e$ and $t_e$ in the case of the GaN LED having a vertical structure and of a GaN LED having a MESA structure (with an injection layer; FIG. 1) of same dimensions. Of course, the values of the parameters are here given as an example and may vary according to the used manufacturing techniques and to the doping of the semiconductor materials.

TABLE 1

|  | Structure MESA | Structure Verticale |
|---|---|---|
| Résistivité contact: $φ_c$ (Ω · cm) | 17 | 17 |
| Epaisseur contact: $t_c$ (cm) | $3 × 10^{-4}$ | $3 × 10^{-4}$ |
| Résistivité électrode: $φ_e$ (Ω · cm) | $2.5 × 10^{-3}$ | $4 × 10^{-6}$ |
| Epaisseur électrode: $t_e$ (cm) | $0.1 × 10^{-4}$ | $0.1 × 10^{-4}$ |
| Résistivité couche p: $φ_p$ (Ω · cm) | 2 | 2 |
| Epaisseur couche p: $t_p$ (cm) | $0.2 × 10^{-4}$ | $0.2 × 10^{-4}$ |
| Résistivité couche n: $φ_n$ (Ω · cm) | 0.011 | 0.011 |
| Epaisseur couche n: $t_n$ (cm) | $2 × 10^{-4}$ | $2 × 10^{-4}$ |
| Absorption: α (μm$^{-1}$) | $1 × 10^{-3}$ | $1 × 10^{-3}$ |
| Longueur d'atténuation du courant d'injection: $L_s$ (μm) | 51 | 97 |
| Position optimale: $L_{opt}$ (μm) | 190 | 245 |

For each of the LEDs, table 1 shows lateral attenuation distance $L_S$ calculated by means of relation (2') (or simplified relation (2), according to cases), and optimal distance $L_{opt}$ calculated by means of relation (7).

Length $L_S$ is equal to approximately 97 μm in the case of a vertical LED and to approximately 51 μm in the case of a MESA LED. Length $L_{opt}$ is equal to approximately 190 μm in the case of a vertical LED and to approximately 245 μm in the case of a MESA LED for a $10^{-3}$ μm$^{-1}$ absorption α.

To form a photonic crystal, and thus efficiently extract the guided light out of the LED, holes are etched in depth into the upper GaN layer, with a periodicity in the order of the emission wavelength of the LED. The holes of the photonic crystal may be arranged according to a specific geometry. This geometry is generally selected according to the extraction angle and to the polarization which is desired to be given to the extracted light.

Figures 14A, 14B, 14C, 14D:
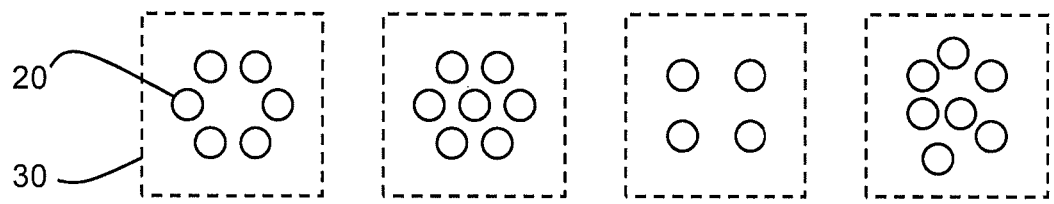
FIGS. 14A to 14D schematically show different photonic crystal geometries.

FIGS. 14A to 14D show various possible photonic crystal geometries. Each geometry corresponds to a pattern having a different shape, this pattern being repeated in the entire photonic crystal, that is, in all extraction areas. In the patterns of FIGS. 14A and 14B, holes 20 form a hexagon, with or without a hole inside of the hexagon. In FIG. 14C, the pattern has a square shape. Finally, in FIG. 14D, no shape has been selected. The holes are randomly etched, but the distance between holes is, in average, of the same order of magnitude as the wavelength. This geometry may be called "randomly periodic". A totally random structuring will extract light, but less efficiently. A linear structure may also be selected to control the polarization of the emitted light.

Preferably, the (average) period of the holes in the photonic crystal is such that the emitted light is diffracted perpendicularly to the plane of the LED. Such an optimal periodicity may be determined by performing a spectral analysis of the emitted light, for the selected geometry. A conventional spectral analysis comprises determining point Γ of an electromagnetic band diagram (TE/TM modes) calculated by the so-called plane wave-basis frequency-domain method.

As an example, for a photonic crystal having a hexagonal geometry, a period of the photonic crystal is in the order of 250 nm. A greater period may be used to obtain a larger light extraction angle, to the detriment of the brightness of the LED. A period smaller than 250 nm (for example, 50 nm) will result in creating a local anti-reflection area promoting the extraction of light, but of low efficiency as compared with a periodic structure of photonic crystal type.

While a surface roughness may be obtained by wet etching, a photonic crystal is usually formed by means of a strongly anisotropic wet etching involving a plasma of charged particles. Now, such an etch technique has a large number of disadvantages: increase of non-radiative recombinations, need to passivate the walls of the etched areas, slow and highly energetic etching . . . .

A method enabling to form any of the light-emitting diodes of FIGS. 6 to 13 is described hereafter. Further, an advantageous way of implementing the step of etching extraction areas 18' forming the photonic crystal is discussed. The etch technique used comprises making the GaN material porous by anodizing under an ultraviolet radiation. It can thus be spoken of porosification, or also of electroporosification. The specificity of such a wet etching is that it enables, under certain conditions, to obtain the periodicity necessary to efficiently extract the guided light. This thus provides the advantages of wet etching, that is, a fast and simple implementation, for the forming of photonic crystals.

FIGS. 15 to 18 show steps of the manufacturing of a light-emitting diode provided with one or a plurality of local extraction areas. These steps concern a vertical-type LED as well as a MESA-type LED. For a MESA LED, the manufacturing method will further comprise a step of etching a well in the semiconductor layers, all the way to the n-type doped GaN layer, followed by a step of depositing the cathode at the bottom of the well.

Figure 15:
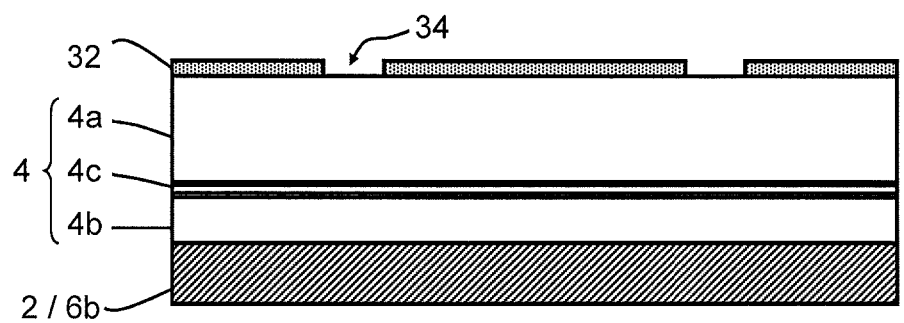
FIGS. 15, 16, and 18 show steps of a method of forming a LED with local photonic crystals according to the invention.

At a first step shown in FIG. 15, a stack 4 of semiconductor material layers is provided. Although two GaN layers, one n-type doped (4a) and the other p-type doped (4b), are sufficient to form a p-n junction, it is preferable to further form nanometer-range structures to promote the emission of photons, such as InGaN quantum wells (4c). The GaN and InGaN layers are for example formed by epitaxy on a sapphire growth substrate 2. Growth substrate 2 may be replaced with an electrically-conductive substrate 6b to form one of the electrodes of the LED (example of a vertical LED).

An etch mask 32, for example, made of silicon nitride, is then formed on stack 4 of semiconductor layers. Mask 32 comprises one or a plurality of openings 34 (two openings 34 in FIG. 15) through which the light extraction areas will be etched. Openings 34 are preferably distributed in mask 32, to obtain a plurality of different extraction areas distributed across the entire surface of the LED.

Etch mask 32 may be formed by first depositing a silicon nitride layer over the entire surface of the LED, and then by etching openings 34 in this layer.

Openings 34 may be individual (one opening per hole 20) or collective (one opening per extraction area 18') as in FIG. 15. Openings 34 of the mask for example have the shape of a circle. Their diameter advantageously ranges from 10 nm to 10 μm, to obtain patterns having a diameter in the approximate range from 10 nm to 20 μm.

Figure 16:
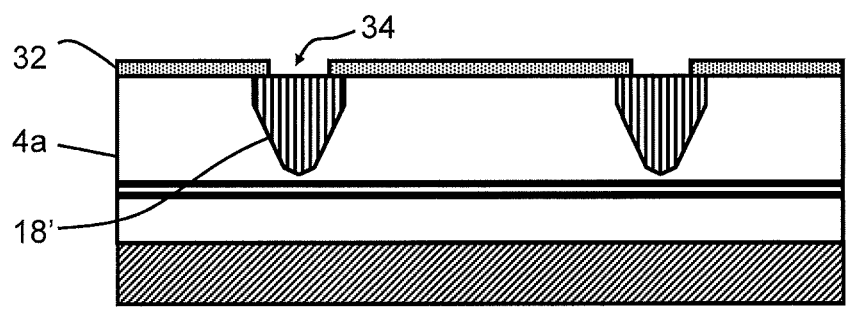

At the step of FIG. 16, extraction areas 18' of the photonic crystal are etched through recesses 34 of mask 32. Several conventional etch techniques may be used, particularly a dry plasma etching. However, in a preferred embodiment, the etching of the photonic crystal is obtained by anodic dissolution.

Figure 17:
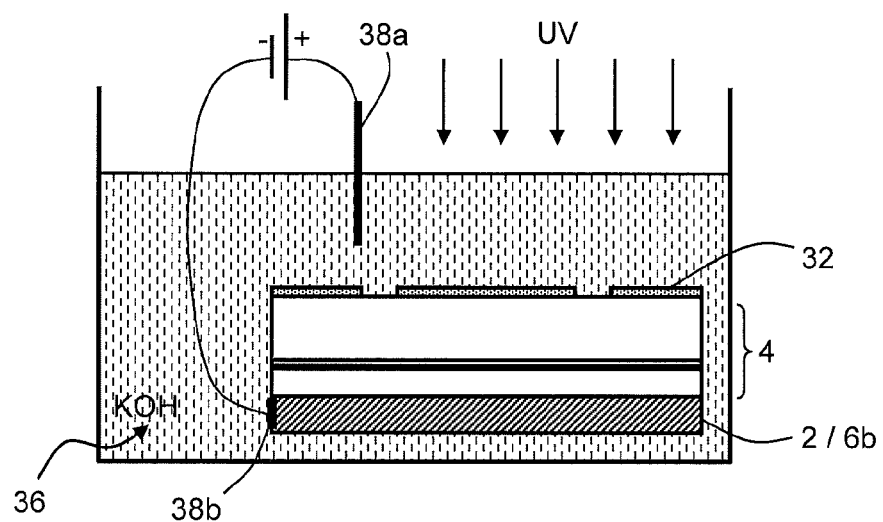
FIG. 17 schematically shows a step of etching the photonic crystals by anode dissolution under ultraviolet rays.

FIG. 17 illustrates an operating mode for this step of electrochemical treatment by anodic dissolution. It of course applies whatever the geometry of the LED and the geometry of the etch mask (especially the number of recesses in the mask).

The substrate having stack 4 of semiconductor layers formed thereon, that is, growth substrate 2 or conductive substrate 6b which replaces it, is covered with etch mask 32, and then dipped into an electrolyte bath 36 based on potassium hydroxide (KOH). A first electrode 38a is dipped into electrolyte 36 and a second electrode 38b is arranged in contact with substrate 6b. The electrodes enable to convey the charge carriers necessary for the GaN anodizing operation.

When the substrate is not conductive or little conductive, in a LED having a MESA structure, for example, electrode 38b is arranged to be in electric contact with the GaN layer located on this substrate (n-GaN layer 4a in FIG. 1).

The local porosification through the nitride mask is preferably performed in a KOH (potassium hydroxide) bath having a concentration in the range from 0.1% to 50% by weight, under an ultraviolet illumination (wavelength from 100 to 400 nm, dose from 0 to 100 W/cm²). The current density used to make the GaN (n- and p-type doped) porous varies from a few mA/cm² to several A/cm² with voltages varying from 1 V to 200 V. The etch times are in the range from a few tens of seconds to several hours. Other electrolytes may be used for the porosification of GaN, such as NaOH, $H_3PO_4$, HCl, $K_2S_2O_8$.

At the end of the anodizing step, porous areas 18' having their dimensions under mask 32 slightly greater than those of recesses 34 are obtained (FIG. 16). The pores of areas 18', having a longitudinal shape, extend vertically in GaN layer 4a.

The pores are spaced apart from one another by an average distance in the range from 5 nm to 1 μm. In other words, porous areas 18' obtained by anode dissolution may have an average periodicity of the same order of magnitude as the emission wavelength, which makes them favorable to the extraction of light. Indeed, the average optical refraction index of the porous areas is smaller than the refraction index of solid GaN, as is also the case for the average index of a plasma-etched photonic crystal.

The etching of the photonic crystal by anodic dissolution applies for n-type doped GaN as well as for p-type doped GaN. Further, such an etch technique enables to easily control the shape and the dimensions of the pores. As an example, in the above-described operating conditions, the pores have a depth which progressively varies in each porous area 18', from 10 nm to a few micrometers. The V-shaped etch profile in FIG. 16 is also obtained by the above-described operating conditions, that is, by adapting the KOH concentration, the current density, and the mask aperture rate.

By thus progressively adapting the optical index of each porous area 18' to the different modes of guided light propagating in the LED, the reflection of part of the light by areas 18' is avoided. More guided light can then be extracted from the LED.

The anodizing step thus enables to easily obtain a geometry similar to that provided in document US2006/0192217, which used to be difficult to implement with conventional etch techniques.

Figure 18:
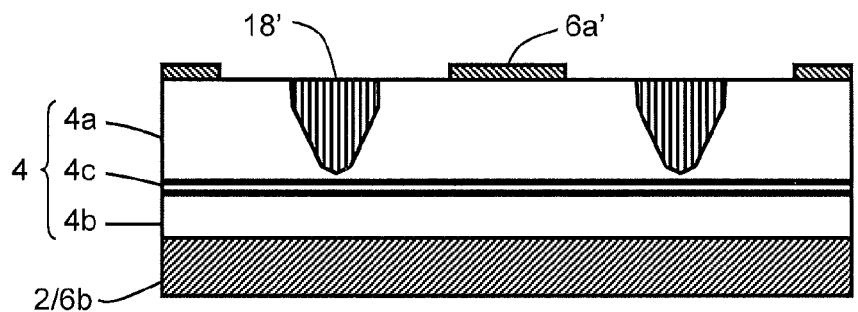

At the step of FIG. 18, the silicon nitride mask is removed, after which an electrode is formed at the surface of stack 4 of layers of semiconductor material. Preferably, the electrode is formed by depositing a plurality of electrically-conductive tracks 6a' on GaN layer 4a.

When the LED comprises a plurality of extraction areas, as shown in FIG. 18, a conductive track 6a' is preferably arranged between each pair of consecutive extraction areas 18', and advantageously at an equal distance from these two areas. Electrically-conductive tracks 6a' may also be arranged on the edges of the LED, so that all areas 18' are located between two electric tracks 6a'. A distance L close to $L_{opt}$ (relation (7)) separates each extraction area 18' from the conductive tracks 6a' adjacent thereto.

If the LED comprises a single extraction area, the electrode may be formed of a single conductive track. Thus, the extraction area and the electrode are separated by a distance L such that $0.9 \cdot L_{opt} \leq L \leq 1.1 \cdot L_{opt}$. Single extraction area 18' may also be located between two conductive tracks, arranged on either side of the extraction area or surrounded by four conductive tracks.

The above-described method is particularly fast and simple to implement. The etching of the photonic crystal by anodic dissolution of the semiconductor material enables to precisely control the geometric parameters of the extraction areas: pore dimensions, average periodicity of the pores, and shape of the porosified areas. A photonic crystal having its geometry optimized for light extraction, while doing away with implementation difficulties, can thus be obtained.

Figure 19:
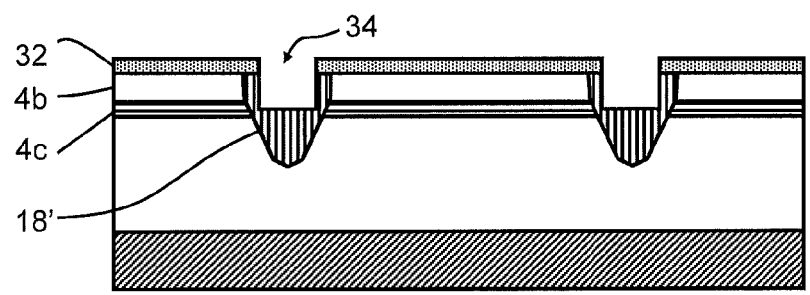
FIG. 19 shows an alternative implementation of the step of FIG. 15.

FIG. 19 shows an alternative embodiment of the step of FIG. 15, for the forming of a LED having a MESA or vertical structure.

After the opening of silicon nitride mask 32 but before the porosification, semiconductor layers, and more particularly p-GaN layer 4b (MESA structure of FIG. 19) or n-GaN layer 4a (vertical structure of FIG. 15), are etched to give the porosified areas a particular shape. In the case of the vertical LED (FIG. 15), p-GaN layer 4b and active layer 4c may also be etched before the porosification to make the obtaining of a V-shape easier (for example, when the control of the KOH concentration, of the current density, and of the mask aperture ratio, is no longer sufficient).

Many alterations and modifications of the light-emitting diode with a local photonic crystal will occur to those skilled in the art. Although the LED and its manufacturing method have been described in relation with materials based on gallium nitride, other semiconductor materials may be used, particularly materials based on gallium arsenide (GaAs), of gallium phosphide (GaP), and on indium phosphide (InP). Light-emitting diodes having a local photonic crystal of high brightness, with various emission wavelengths, can thus be obtained.

The invention claimed is:

1. Light-emitting diode comprising:
   a first layer of a doped semiconductor material of a first conductivity type;
   a second layer of a doped semiconductor material of a second opposite conductivity type;
   an active light-emitting area located between the first and second layers of semiconductor material;
   an electrode arranged on the first layer of semiconductor material; and
   a photonic crystal formed in the first layer of semiconductor material;
   wherein the photonic crystal and the electrode are separated by a distance L verifying, to within 10%, the following equation:

$$L = \frac{L_S}{\alpha L_S - 1} \ln \frac{(\eta_B - \eta_A)}{\eta_B - \eta_A \alpha L_S} \frac{\alpha L_S}{}$$

wherein:
$L_S$ is the distance, from the electrode, at which the current density in the active light-emitting area is equal to the current density under the electrode divided by e;
α is the absorption coefficient of the light modes propagating in the first and second layers of semiconductor material and in the active light-emitting area;
$\eta_A$ is the light extraction coefficient in a portion of the first and second layers of semiconductor material and of the active light-emitting area, located between the electrode and the photonic crystal; and
$\eta_B$ is the light extraction coefficient in the area of the photonic crystal.

2. Diode according to claim 1, wherein the electrode comprises a plurality of electrically-conductive track and wherein the photonic crystal comprises a plurality of light extraction areas distributed in the first semiconductor material layer, each extraction area being located between two electrically-conductive tracks.

3. Diode according to claim 2, wherein each extraction area is located at an equal distance from the two electrically-conductive tracks.

4. Diode according to claim 2, wherein the distribution of the extraction areas in the first semiconductor material layer is periodic.

5. Diode according to claim 2, wherein two consecutive extraction areas are separated by a distance shorter than the average distance traveled by photons before they are absorbed in the semiconductor material.

6. Diode according to claim 1, wherein the photonic crystal comprises periodically spaced apart holes extending through the first layer of semiconductor material all the way to the active light-emitting area.

7. Diode according to claim 6, wherein the holes of the photonic crystal extend through the active light-emitting area.

8. Diode according to claim 6, wherein the holes of the photonic crystal have a progressively-varying depth.

9. Method of manufacturing a light-emitting diode comprising the steps of:
providing a first layer of a doped semiconductor material of a first conductivity type, a second layer of a doped semiconductor material of a second opposite conductivity type, and an active light-emitting area located between the first and second layers of semiconductor material;
forming an electrode on the first layer of semiconductor material; and
etching a photonic crystal in the first layer of semiconductor material, the photonic crystal and the electrode being separated by a distance L verifying, to within 10%, the following equation:

$$L = \frac{L_S}{\alpha L_S - 1} \ln \frac{(\eta_B - \eta_A) \alpha L_S}{\eta_B - \eta_A \alpha L_S}$$

wherein:
$L_S$ is the distance, from the electrode, at which the current density in the active light-emitting area is equal to the current density under the electrode divided by e;
α is the absorption coefficient of the light modes propagating in the first and second layers of semiconductor material and in the active light-emitting area;
$\eta_A$ is the light extraction coefficient in a portion of the first and second layers of semiconductor material and of the active light-emitting area, located between the electrode and the photonic crystal; and
$\eta_B$ is the light extraction coefficient in the area of the photonic crystal.

10. Method according to claim 9, wherein the photonic crystal is etched through a mask comprising a plurality of recesses, which results in a plurality of light extraction areas distributed in the first semiconductor material layer.

11. Method according to claim 10, wherein the electrode is formed of a plurality of electrically-conductive tracks, one track being arranged between each pair of consecutive extraction areas.

12. Method according to claim 10, wherein the etching of the photonic crystal is obtained by anode dissolution under ultraviolet rays of the layer of semiconductor material.

* * * * *